United States Patent [19]

Glover

[11] 3,893,233

[45] July 8, 1975

[54] METHOD OF CONNECTING A CONTACT PIN TO LAMINATED BUS BARS

[75] Inventor: Douglas Wade Glover, Harrisburg, Pa.

[73] Assignee: AMP Incorporated, Harrisburg, Pa.

[22] Filed: Sept. 18, 1972

[21] Appl. No.: 290,013

Related U.S. Application Data

[63] Continuation-in-part of Ser. No. 152,145, June 11, 1971, abandoned.

[52] U.S. Cl. .................... 29/628; 29/525; 174/72 B; 174/88 B; 317/101 CM; 317/101 CC; 264/154

[51] Int. Cl.² ...................... H01R 43/00; H05K 1/04

[58] Field of Search ............... 174/68.5, 72 B, 88 B; 339/22 B, 17 C, 17 E; 29/626, 624, 628, 630 R; 317/101 CM, 101 CE, 101 D, 101 CC; 29/525

[56] References Cited

UNITED STATES PATENTS

| | | | |
|---|---|---|---|
| 3,444,617 | 5/1969 | Stricker et al. | 29/626 |
| 3,660,726 | 5/1972 | Ammon et al. | 317/101 CM |
| 3,662,088 | 5/1972 | Wright et al. | 174/72 B |
| 3,663,866 | 5/1972 | Iosue et al. | 317/101 CM |

*Primary Examiner*—Darrell L. Clay
*Attorney, Agent, or Firm*—Gerald K. Kita

[57] ABSTRACT

A bus bar of laminar construction useful for power distribution systems and the like is disclosed which features an improved contact pin arrangement for providing input, output, and ground connections to the bus bar, together with an improved method of fabricating the bus bar and installing the contact pins or posts. The bus bar comprises a plurality of metallic conductors in sheet form separated by insulator films in a laminated structure, alternate conductor sheets serving as ground planes with the power signal conductors interleaved between the ground conductors. The conductor sheet - insulator film sandwich is clamped between cover members of phenolic or glass epoxy and the whole is encapsulated in a semi-rigid epoxy which extends between and under the conductor sheets at one end thereof. Finally, a series of holes is drilled through the laminated structure thus formed and particularly through the conductor sheets and semi-rigid epoxy and metallic pins or posts are inserted under force into these holes to effect a mechanical and electrical connection of high quality with the separate signal conductors and ground conductors for external access to the elements of the bus bar. The post or pin is larger in cross-sectional area than the hole and at least one cross-sectional dimension of the pin through the center of the cross-section is larger than the diameter of the hole. A bead of an epoxy adhesive is placed over the hole prior to pin insertion. Insertion of the pin then carries only so much epoxy therewith as will go into the hole to provide additional adhesion of pin to bus bar as well as hermetic seal.

6 Claims, 12 Drawing Figures

PATENTED JUL 8 1975 3,893,233

SHEET 1

METHOD OF CONNECTING A CONTACT PIN TO LAMINATED BUS BARS

This application is a continuation-in-part of my prior copending application, Ser. No. 152,145, filed June 11, 1971, now abandoned.

The art has faced a difficult problem in providing external connections to laminated bus bars, i.e., to the individual conductor elements thereof. Prior to this invention, the practice has been to employ conductor sheets of relatively complex shape with tabs containing holes or slots being required to receive the contact pins which were mounted in placed and soldered to effect the connection. Problems were created in that art work to etch the conductor sheets was complex, with handling and registration or alignment of the plurality of conductor sheets during manufacture of the laminated bus bar becoming critical. Thus the conductor sheets had to be carefully aligned so that the contact pins would fit properly. Finally the insertion and soldering of individual pins was a time consuming step which had to be followed.

It is an object of the present invention to provide an improved bus bar for power distribution systems which features a novel construction of the contact pins or posts required to make external connections to the conductive members thereof, for purposes of input, output, and ground connections.

Another object is to provide a new and improved method of fabricating laminated bus bars of the type just referred to, and especially to a novel technique for inserting contact posts therein and obtaining a mechanical and electrical connection between such posts and the conductive members of the bus bar.

A further object of the invention is to provide a solderless method of making connection to a laminated bus bar and the connection.

A yet further object of the invention is to provide a method for easily and accurately aligning apertures in a laminated bus bar for reception of a contact pin or post.

A still further object of the invention is to provide a laminated bus bar having substantially circular apertures for reception of a substantially square post, the diameters of the aperture being substantially the same as or slightly less than the width of the post so that the post corners bite into the regions around the apertures.

It is yet another object of this invention to provide a method for making a laminated bus bar which eliminates voids due to capillary action of an epoxy in a mold.

It is still another object of this invention to provide a method of hermetically sealing a post in a laminated bus bar by allowing an epoxy to travel into the bus bar aperture with the post to fill all voids between post and bus bar.

The bus bar is formed as a laminated structure which includes metallic sheet conductors separated by insulating films affixed to the conductors by an adhesive. Ground plane conductors and power signal conductors are interleaved in the laminated structure, and staggered connection tabs are located along one longitudinal edge. The lamination structure is first formed as a completed unit, and then holes are drilled at predetermined locations along the one edge to intersect the tabs of the conductive sheets. Metallic contact posts, suitably dimensioned according to the teachings herein, are force fitted into the drilled holes along with an epoxy as the final step in forming the bus bar of the invention. In this step the material of the metallic sheet conductors is deformed and cold forged to achieve a good electrical connection, there being a wiping action which takes place between all contacting surfaces.

Other objects and attainments of the present invention will become apparent to those skilled in the art upon a reading of the following detailed description when taken in conjunction with the drawings in which there is shown and described an illustrative embodiment of the invention; it is to be understood, however, that the embodiment is not intended to be exhaustive nor limiting of the invention but is given for purposes of illustration in order that others skilled in the art may fully understand the invention and the principles thereof and the manner of applying it is practical use so that they may modify it in various forms, such as may be best suited to the conditions of a particular use.

IN THE DRAWINGS

Figure 6:
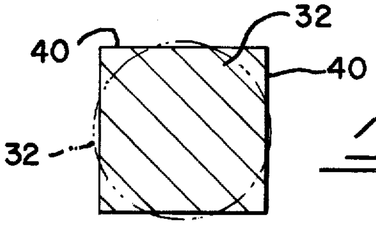
FIG. 6 is a diagram to aid in explaining the manner of obtaining an improved mechanical and electrical connection between contact post and conductive sheet in accordance with the invention.
Figure 6A:
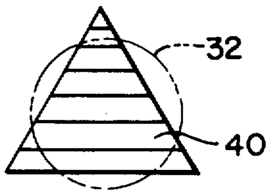

FIG. 6*a* is similar to FIG. 6 showing in cross-section a post of triangular shape.

Figure 1:
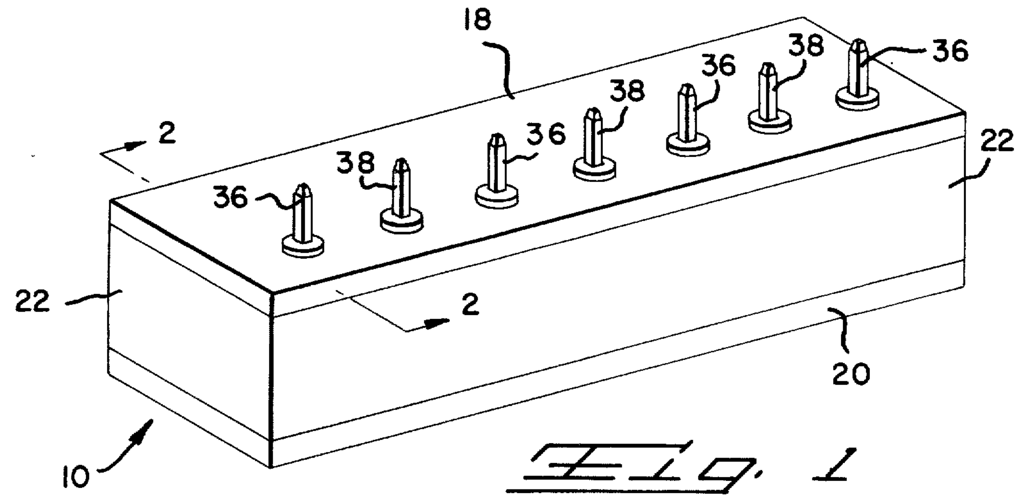
FIG. 1 is a perspective view of a power distribution system bus bar in accordance with the present invention.
Figure 8A:
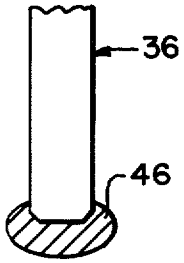
Figure 7:
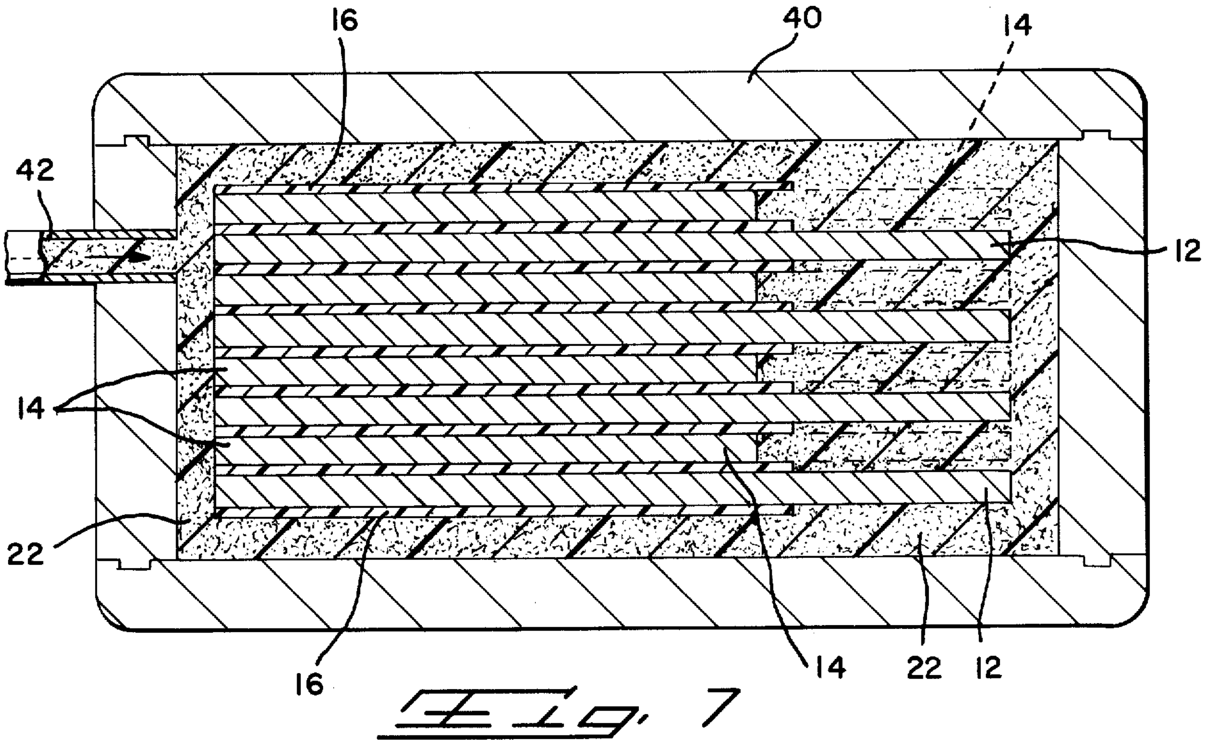
Figure 8:
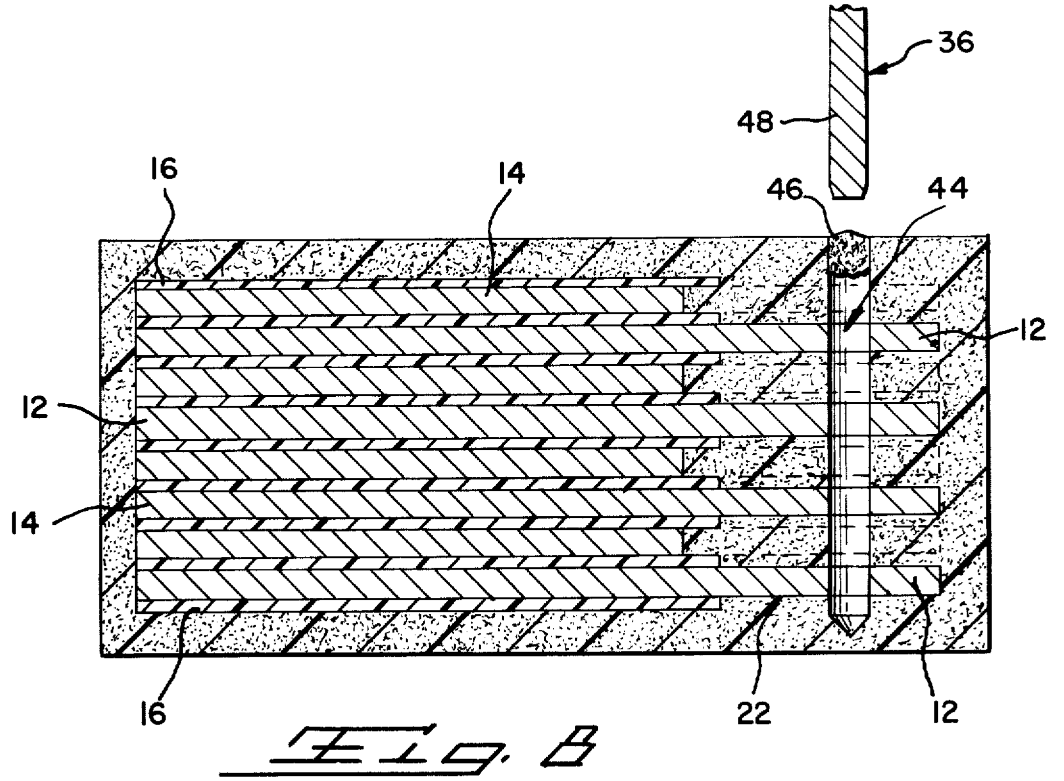

FIG. 7, is a cross-sectional view of a mold in which the bus bar in accordance with the present invention has epoxy added therein;

FIG. 8 is a cross-sectional view of a completed bus bar similar to FIG. 1 with a drop of epoxy in the aperture for receiving a post;

FIG. 8*a* shows the bottom end of the post with a drop of epoxy before being driven into the aperture.

Figure 9:
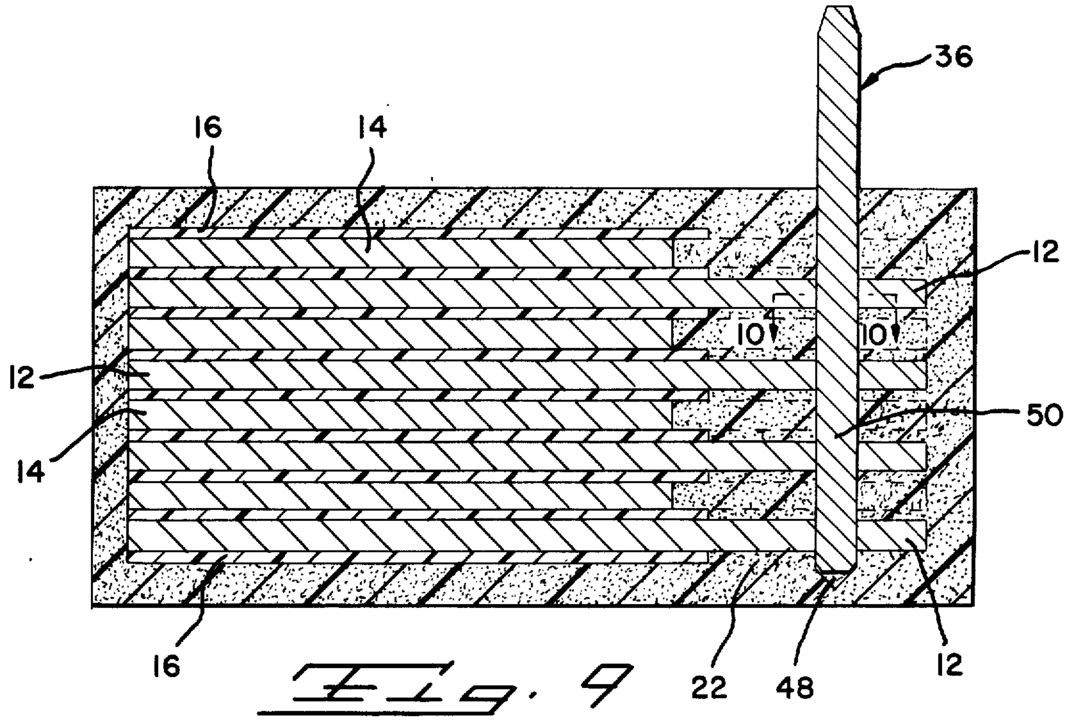
Figure 10:
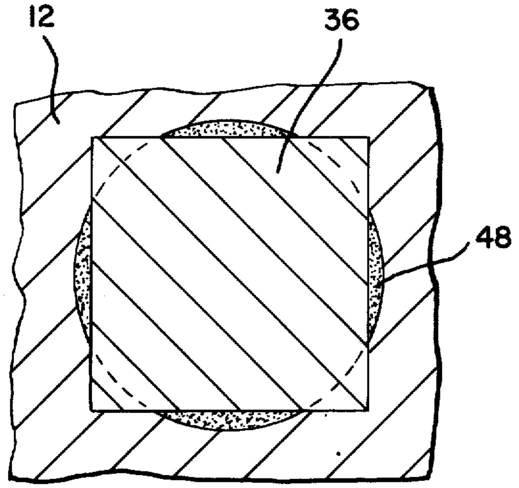

FIG. 9 is a cross-sectional view as in FIG. 8 after the post has been applied to the bus bar; and FIG. 10 is a view taken along the line 10—10 of FIG. 9.

As previously indicated, the invention concerns a solderless method and a means for terminating contact pins or posts to the conductive element of a laminated bus bar. The laminated bus bar is a sandwich arrangement of components, as is best disclosed by FIG. 2. The terminating posts are installed subsequent to the fabrication of bus bar itself, the resulting structure being as illustrated in perspective in FIG. 1. The method and means for termination according to the invention simplifies the fabrication of bus bars, reduces costs, relaxes tolerance requirements, and produces a mechanical and electrical interconnection of post and bus bar conductor of exceptionally high quality.

Figure 2:
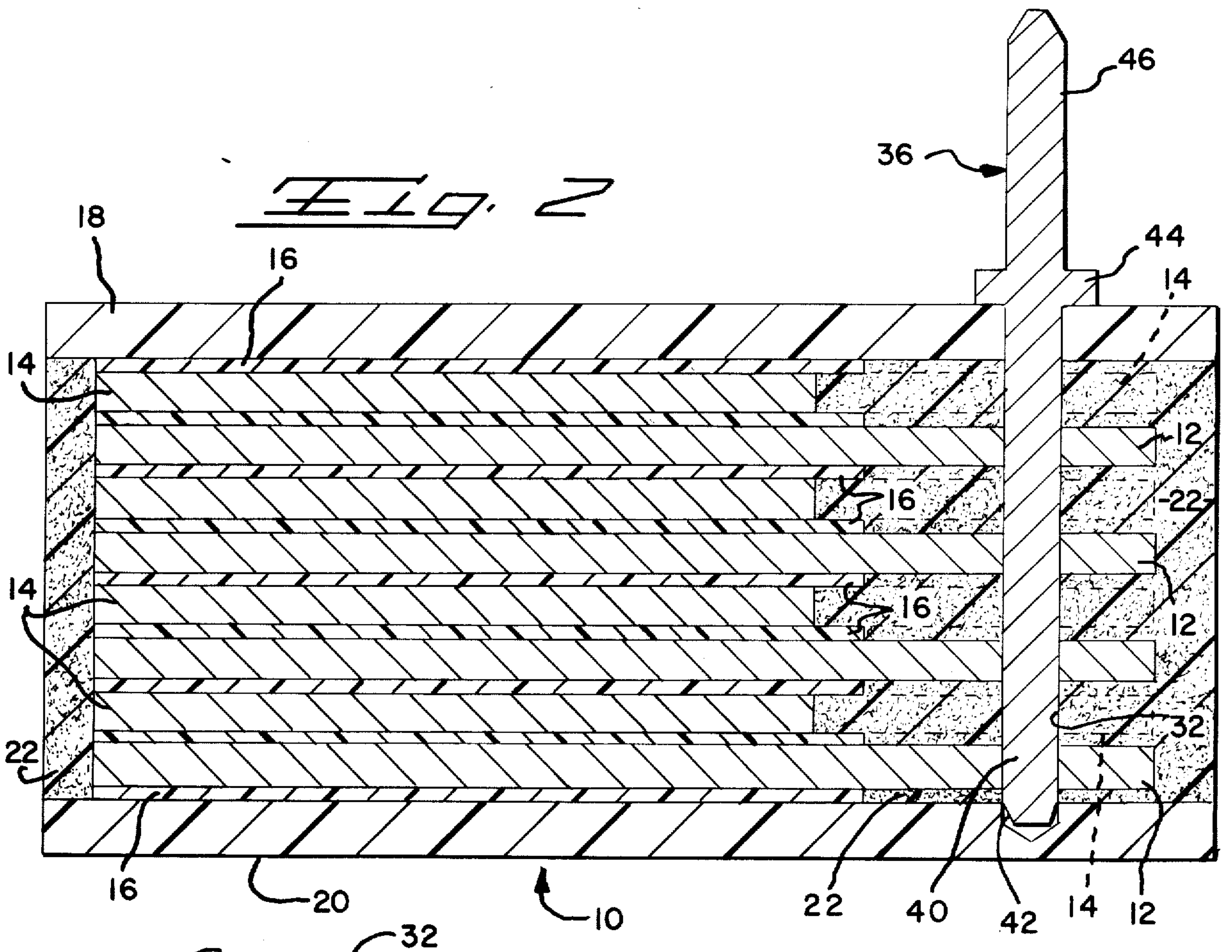
FIG. 2 is a cross-sectional view showing the details of the laminated bar, with the contact pins or posts installed, the cross-section being taken along line 2—2 in FIG. 1.

Referring to FIGS. 1 and 2, the laminated bus bar 10 is disclosed as comprising a plurality of relatively thin metallic sheets 12, of copper or any other suitable electrically conductive material which are interleaved with a like plurality of similar metallic sheets 14. The sheets 12 serve as ground planes as will be seen subsequently, while the other sheets 14 (also of copper or the like) are the power signal conductors. All of the conductive sheets are electrically separated from one another by a plurality of identical thin insulating members 16. These members 16 may be of any suitable electrically insulating material normally used in bus bar construction. In the preferred embodiment shown, they are sheets of Mylar film. In forming the laminations into a sandwich arrangement as shown in the drawing, both faces of each insulating member 16 will have first been coated with a conventional dry, thermoplastic adhesive. Outer covers 18 and 20 of insulation, which may preferably be of phenolic or a glass epoxy, are also provided to serve as the top and bottom covers for the built up laminations.

In laminating the covers 18 and 20 and the component sheets 12, 14 and 16 into a unitary structure, these elements are put together in the positions shown in FIG. 2 and are clamped in place by any suitable means, not shown. They are then subjected to heat and pressure in conventional manner in order to activate the thermoplastic adhesive materials. After cooling of the structure, it is sealed and mechanically completed by encapsulating the laminated sandwich with a suitable low viscosity epoxy filler 22 which is poured in all around the outside edges of the bus bar. The epoxy encapsulant 22 occupies the volume shown in FIG. 2, and is allowed to cure and harden. The epoxy 22 is preferably a semi-rigid epoxy of low viscosity which will confine the copper sheets 12, 14 to their own planes and rigidly seal all the bus bar elements within the cover members 18, 20.

The bus bar is encapsulated in the epoxy encapsulant by placing the bus bar into a mold 40 as shown in FIG. 7 with the bottom surface of the bus bar spaced from the floor of the mold. The epoxy is then poured into the mold through metered inlet 42 and, due to the epoxy wetting action, the epoxy flows along the bus bar and completely seals all surfaces thereof. A gating device is built into the mold in the form of a thin tube or the like whereby a metered flow rate of epoxy into the mold is provided, thereby allowing the epoxy to flow along the bus bar due to capillary action. This eliminates voiding since the epoxy wets along the bus bar surfaces and removes the air from the mold.

Figure 4:
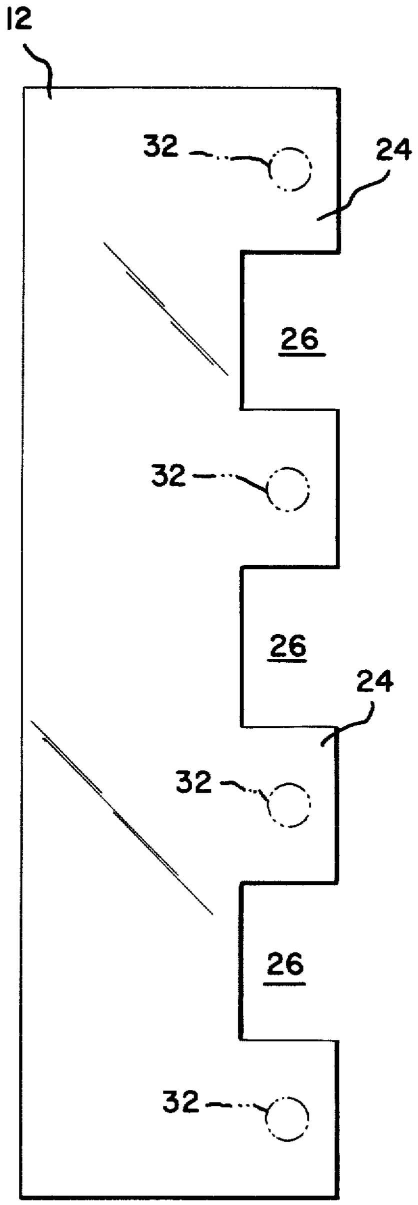
FIG. 4 is a similar plan view of one of the ground conductive sheets or elements of the bus bar of the invention.

The ground sheets 12 are each made to have a particular shape or outline along one longitudinal edge such as is shown in FIG. 4. Thus one edge of each sheet 12 has a set of protruding contact tabs or portions 24 separated by areas 26 where the sheet has been cut away. The power signal conductors 14 each have a similarly shaped longitudinal edge comprising protruding contact tabs 28 separated by cutout areas 30. It should be noted that tabs 28 are staggered or interspersed, in the longitudinal direction, with respect to the other tabs 24, for a purpose to be described.

At this stage the bus bar is complete except for providing the necessary external connections for input, output and ground.

Figure 3:
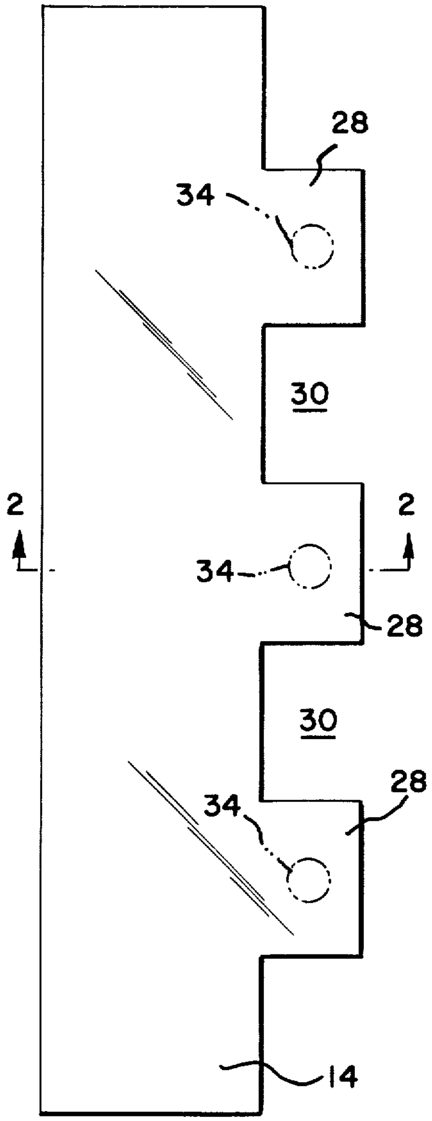
FIG. 3 is a plan view of one of the metallic sheets of the laminated bus bar, this view being of one of the power signal conductors.

In accordance with the novel concepts of the invention, terminations for such inputs, outputs, and ground connections are achieved in the following manner. After the lamination of the bus bar as described above has been completed, a series of holes 32 is drilled in the device at locations along the longitudinal edge of the bar 10 which are substantially at the centers of the tabs 24 of the ground conductor sheets 12. The holes extend through all elements except bottom cover 20, one such hole 32 being shown in FIG. 2 and the locations of the other holes 32 being shown dotted in FIG. 4. Another set of holes 34, interspersed between holes 32 along the aforesaid edge, are similarly drilled at locations which intersect the tabs 28 of the power signal conductors 14. The latter are shown in phantom in FIG. 3. In this manner, there is perfect alignment of the holes drilled through each laminum along the holes 32 or 34.

The desired terminations are effected by inserting a plurality of metallic contact pins or posts 36 into the holes 32 and further identical contact posts 38 into holes 34, these posts being dimensioned, relative to the diameter of holes 32 and 34, to require an interference or force fit. The posts 36 and 38 may be driven into place by any suitable mechanical force producing means. The posts have the shape shown in FIG. 2, and include a lower contact making portion 40 with a lower end tapered as at 42 for ease of entry into the corresponding drilled hole, a shoulder 44 and an external portion 46 which provides a means for external connection. Connections may be made to post portions 46 by the soldering of leads thereon, or by conventional wrap-type connections of clip-type connections. The post is preferably larger in cross-sectional area than the hole, though this is not absolutely necessary. However, one diagonal of the post must be longer than the diameter of the hole.

The posts 36 and 38 are of course of a conductive metallic material of the type normally used in connector devices, such a beryllium copper or Phosphor bronze. They are preferably of a square cross-section but also could be rectangular, triangular or polygonal in cross-section. FIG. 6 is a diagrammatic illustration of the necessary relative dimensions of post and hole. The perimeter of the post is indicated at 40 while dotted line 32 represents the circumference of the drilled hole. The hole should have a diameter greater than the overall thickness dimensions of the post, but the post corners should be outside the hole periphery of the hole to provide for the interference fit or force fit required as referred to above.

The post, which is harder than the epoxy 22 is driven into the aperture in the same manner as a nail, the epoxy 22 between the conductors 12 being sufficiently rigid so that movement of the post through the aperture does not deform the conductors 12 downwardly so that adjacent conductors 12 at the right of FIG. 2 or adjacent conductors 12 and 14 at other regions of the bus bar are short circuited to each other. In other words, deformation around the aperture due to insertion of the post is minimal though there is a good wiping action between post and conductor 12 due to the relative dimensions of the post and aperture. The major deformation is away from the hole or in a direction normal to the path of travel of the post due to the relative hadrnesses of the post material and the epoxy 22.

In a typical example of a laminated bus bar actually constructed in accordance with the invention, sheets 12 and 14 were formed of 0.005 thick, ½ H., ETP copper, while the insulator sheets 16 were a Mylar film with a dry thermoplastic adhesive coated on each face prior to lamination. The covers 18 and 20 were of phenolic material, and contact posts or pins 36, 38 were of beryllium copper. The encapsulating compound 22 was a semi-rigid low viscosity epoxy commercially available and indentified as HYSOL Epoxy Patch Kit No. 0151. The posts were of a square cross-section, 0.025 inch ± 0.00. inch on a side, and holes 32 and 34 had a diameter of 0.026 inch, =0.002 inch and −0.001 inch tolerances. There resulted an excellent mechanical and electrical connection between posts and the bus bar conductors, providing a stable, low resistance electrical connection therebetween.

Figure 5:
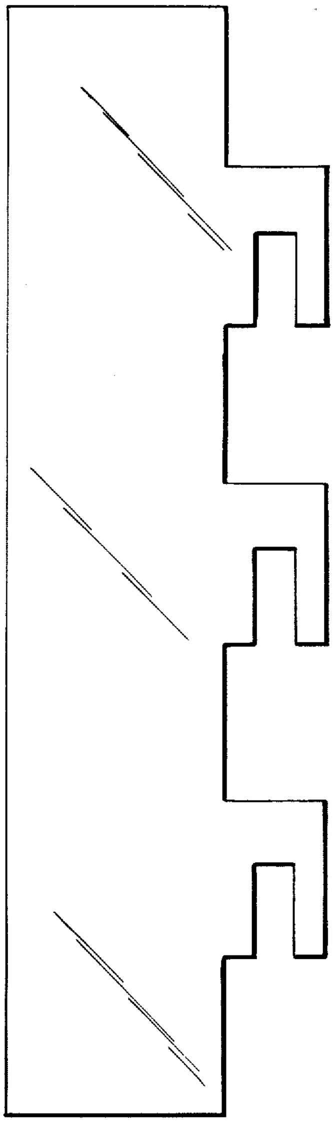
FIG. 5 is a plan view of a metallic conductive sheet of the kind previously required as conductor elements for prior laminated bus bars, included to aid in visualizing the advantages afforded by the practice of this invention.

Bus bars were previously made with conductor sheets of relatively complex shapes such as shown by FIG. 5. The sheets had to be mutually aligned so that the narrow slots shown in the Figure would register with one another, permitting contact pins to be placed therein and then soldered to make the electrical connection. The handling problems were considerable, with tolerances and alignment becoming critical problems also. The art work for forming conductors was more complex, and the contact pins were in the way when the encapsulant was poured in place as a further complication.

With the invention the conductor sheets have simplified shapes, the posts are installed after the laminated structure had been completed making this aspect of the process easier, and soldering, with its difficulties an unreliability, is avoided entirely.

Referring now to FIG. 8, there is shown a bus bar as manufactured in the mold of FIG. 7 and similar to the bus bar of FIG. 2. The aperture 44 has been provided for receiving the post 36. A globule of epoxy 46 is positioned at the upper surface of the aperture 44 prior to insertion of the post. Accordingly, upon post insertion, as shown in FIGS. 9 and 10, the epoxy travels downwardly and normal to the path of post travel to fill the voids 48 as well as provide an additional securing of the post 36 in the aperture 44. As an alternative, the epoxy can be placed around the lower portion 50 of the post 36 to replace the globule of epoxy 46, An uncured epoxy which cures at room temperature is preferably used.

The providing of the sealing encapsulant 22 is important with regard to the electrical connection which is obtained. It is thought that the encapsulant confines the copper sheets 12, 14 to their own planes during forced insertion of the posts, constraining the copper material against any movement due to the interference force of the post insertion. There is a deformation of the copper sheet to form the electrical connection, accompanied by a wiping action of all surfaces to produce the high quality connection as referred to above.

It will, therefore, be appreciated that the aforementioned and other desirable objects have been achieved; however, it should be emphasized that the particular embodiment of the invention, which is shown and described herein, is intended as merely illustrative and not as restrictive of the invention.

What is claimed is:

1. A method of making electrical connection to a laminated bus bar assembly having alternate layers of rigid insulator material and electrically conductive material, comprising forming an aperture of uniform dimensions in the assembly to a predetermined depth normal to the lamina and extending through predetermined adjacent ones of said lamina, driving into the aperture of the assembly a conductive post having angularly related walls biting into the aperture wall including that of the conductor and distorting the material of the conductor layer in its own plane while the remainder of the post walls are within the aperture and spaced from the wall thereof, prior to the step of driving said post into the aperture of the assembly, placing a globule of uncured epoxy on one of the post and entrance to the aperture of the assembly to fill the space between the post and aperture walls, and allowing said epoxy to cure subsequent to driving the post into the aperture.

2. A method as set forth in claim 1 wherein said step of forming an aperture comprises forming an aperture having a circular cross-section and said step of driving the post comprises driving a post which has a rectangular cross-section.

3. A method as set forth in claim 2 wherein the step of driving the post comprises driving a rectangular post having a diagonal which is longer than the diameter of said aperture.

4. A method as set forth in claim 1 wherein the step of forming an aperture comprises forming an aperture which has a circular cross-section and the step of driving the post comprises driving a post which has a triangular cross-section.

5. A method according to claim 1 wherein the step of placing a globule of uncured epoxy on one of the post and entrance comprises placing the uncured epoxy at the entrance to the assembly aperture before driving the post.

6. A method according to claim 1, wherein the step of placing a globule of uncured epoxy on one of the post and entrance comprises placing the uncured epoxy on the post prior to driving it into the assembly aperture.

* * * * *